United States Patent
Shah et al.

(10) Patent No.: US 6,544,879 B2
(45) Date of Patent: Apr. 8, 2003

(54) INSITU RADIATION PROTECTION OF INTEGRATED CIRCUITS

(75) Inventors: Tushar T. Shah, Columbia, MD (US); Keith K. Sturcken, Nokesville, VA (US); Steven Wright, Fredericksburg, VA (US)

(73) Assignee: Bae Systems Information & Electronic Systems Integration Inc.

( * ) Notice: Subject to any disclaimer, the term of this patent is extended or adjusted under 35 U.S.C. 154(b) by 0 days.

(21) Appl. No.: 10/226,163

(22) Filed: Aug. 22, 2002

(65) Prior Publication Data

US 2002/0195719 A1 Dec. 26, 2002

Related U.S. Application Data

(62) Division of application No. 09/722,599, filed on Jan. 30, 2001, now Pat. No. 6,504,256.

(51) Int. Cl.[7] .............................................. H01L 21/44
(52) U.S. Cl. ..................................................... 438/613
(58) Field of Search .............................. 257/780, 781; 438/613, 118

(56) References Cited

U.S. PATENT DOCUMENTS

| | | | |
|---|---|---|---|
| 4,998,159 A | * | 3/1991 | Shinohara et al. .......... 361/809 |
| 5,635,754 A | | 6/1997 | Strobel et al. |
| 5,825,042 A | | 10/1998 | Strobel et al. |
| 5,880,403 A | | 3/1999 | Czajkowski et al. |
| 5,889,316 A | | 3/1999 | Strobel et al. |
| 6,169,329 B1 | * | 1/2001 | Farnworth et al. .......... 257/780 |
| 6,326,698 B1 | * | 12/2001 | Akram ........................ 257/781 |

* cited by examiner

Primary Examiner—David Nelms
Assistant Examiner—Dao H. Nguyen
(74) Attorney, Agent, or Firm—Fogg and Associates, LLC

(57) ABSTRACT

Methods for manufacturing microchips are provided. A plurality of alternating metallic wiring-layers and non-metallic layers, terminating with a metallic wiring-layer, are formed on a wafer. A plurality of vias is formed for electrically interconnecting various metallic wiring-layers. A plurality of electrically conducting pads is formed adjacent various vias. A passivation layer is formed adjacent the terminal metallic wiring-layer and the plurality of conducting pads. A portion of the passivation layer is removed to expose the plurality of conducting pads. A layer is formed adjacent the passivation layer and the plurality of exposed conducting pads for protecting the microchip against electromagnetic radiation. A portion of the protective layer is removed to expose the plurality of conducting pads. Each conducting pad is electrically isolated from the protective layer. An electrically conducting bump is formed on each conducting pad.

12 Claims, 3 Drawing Sheets

INSITU RADIATION PROTECTION OF INTEGRATED CIRCUITS

CROSS REFERENCE TO RELATED APPLICATIONS

This Application is a Divisional of U.S. application Ser. No. 09/722,599 filed Jan. 30, 2001 now U.S. Pat. No. 6,504,256 (allowed).

TECHNICAL FIELD

The present invention relates generally to the field of integrated circuits and, in particular, to radiation protection of integrated circuits.

BACKGROUND

Using integrated circuits in space-related applications requires protecting these circuits from space radiation, such as solar flares, galactic and cosmic radiation, Van Allen trapped electron and proton belts, and neutron and gamma radiation. One method commonly used for protecting circuits from space radiation involves building radiation protection into the chip design. This method involves modifying specific front-end designs and processes to provide radiation protection at the device level. This method is expensive and may delay the release products date, thus the resulting radiation-protected circuits are typically at least two generations behind state-of-the-art technology of non-protected circuits.

Another method commonly used for protecting circuits from space radiation involves testing each part or die lot to obtain the necessary level of radiation protection. This results in significant expenses because of the large amount of required testing. Significant cost is also incurred, because roughly only ten percent of the tested products can be used.

Shielding is yet another method for guarding integrated circuits against space radiation. The shielding technique may include shielding an entire satellite or subsystem. Unfortunately, the materials used to provide this protection add significant weight and cost to the design. Shielding may also include shielding individual integrated circuits, which is cost prohibitive because a custom package would have to be manufactured for each circuit configuration. This method is weight, size, and cost prohibitive.

For the reasons stated above, and for other reasons stated below which will become apparent to those skilled in the art upon reading and understanding the present specification, there is a need in the art for cost-effective, weight- and size-conserving techniques that do not cause product-release date delays and that provide total radiation protection for integrated circuits used in space-related applications.

SUMMARY

The above-mentioned problems with weight, size, cost, product-release date delays, and total radiation protection and other problems related to protecting integrated circuits used in space-related applications from electromagnetic radiation are addressed by embodiments of the present invention and will be understood by reading and studying the following specification.

One embodiment of the present invention provides a method for manufacturing a microchip. The method includes forming a plurality of alternating metallic wiring-layers and non-metallic layers on a wafer, terminating with a metallic wiring-layer. The method includes forming a plurality of vias for electrically interconnecting various metallic wiring-layers and forming a plurality of electrically conducting pads adjacent various vias. Forming a passivation layer adjacent the terminal metallic wiring-layer and the plurality of conducting pads and removing a portion of the passivation layer to expose the plurality of conducting pads are also included in the method. The method includes forming a layer adjacent the passivation layer and the plurality of exposed conducting pads for protecting the microchip against electromagnetic radiation. The method includes removing a portion of the protective layer to expose the plurality of conducting pads. Isolating each conducting pad, electrically, from the protective layer and forming an electrically conducting bump on each conducting pad are also included in the method.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
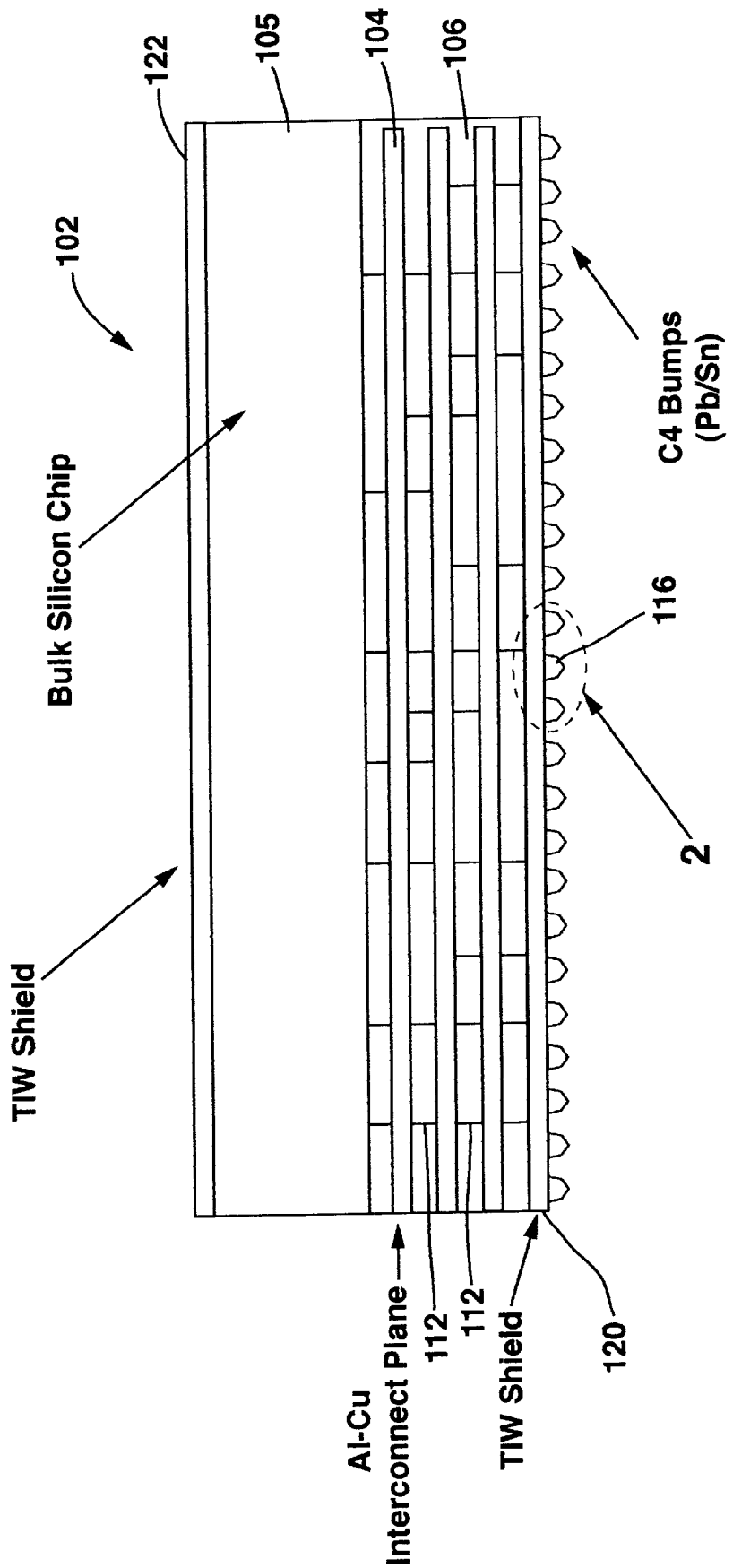
FIG. 1 is a cross-sectional view of the microchip representing the first embodiment of the present invention.

The first embodiment of the present invention is exemplified by microchip 102, in FIG. 1. Microchip 102 has a multitude of alternating metallic wiring layers, exemplified by wiring layer 104 in FIG. 1, and non-metallic layers, exemplified by nonmetallic layer 106 in FIG. 1. The metallic and non-metallic layers are formed on wafer 105. Wafer 105 may be any material suitable for making microchips, such as Si (silicon) $SiO_2$ (silicon dioxide), Ge (germanium), GaAs (gallium arsenide), GaAsP (gallium arsenide phophide), or the like.

In one embodiment, wiring layer 104 may be a formulation of low-Z materials, where a low-Z material is a material having an atomic number less than about 40, such as copper and aluminum. Any metal suitable for microchip wiring layers may be used, however. Suitable metals may include formulations of high-Z materials, where a high-Z material is a material having an atomic number greater than about 40, such as titanium and tungsten. Non-metallic layer 106 may be any semi-conducting material suitable for microchip processing, such as Si, $SiO_2$, Ge, GaAs, GaAsP, or the like. In one embodiment, wiring layer 108 is a formulation of high-Z materials, such as a formulation of titanium and tungsten. Alternatively, wiring layer 108 may be a formulation of low-Z materials, such as a formulation of copper and aluminum.

Figure 2:
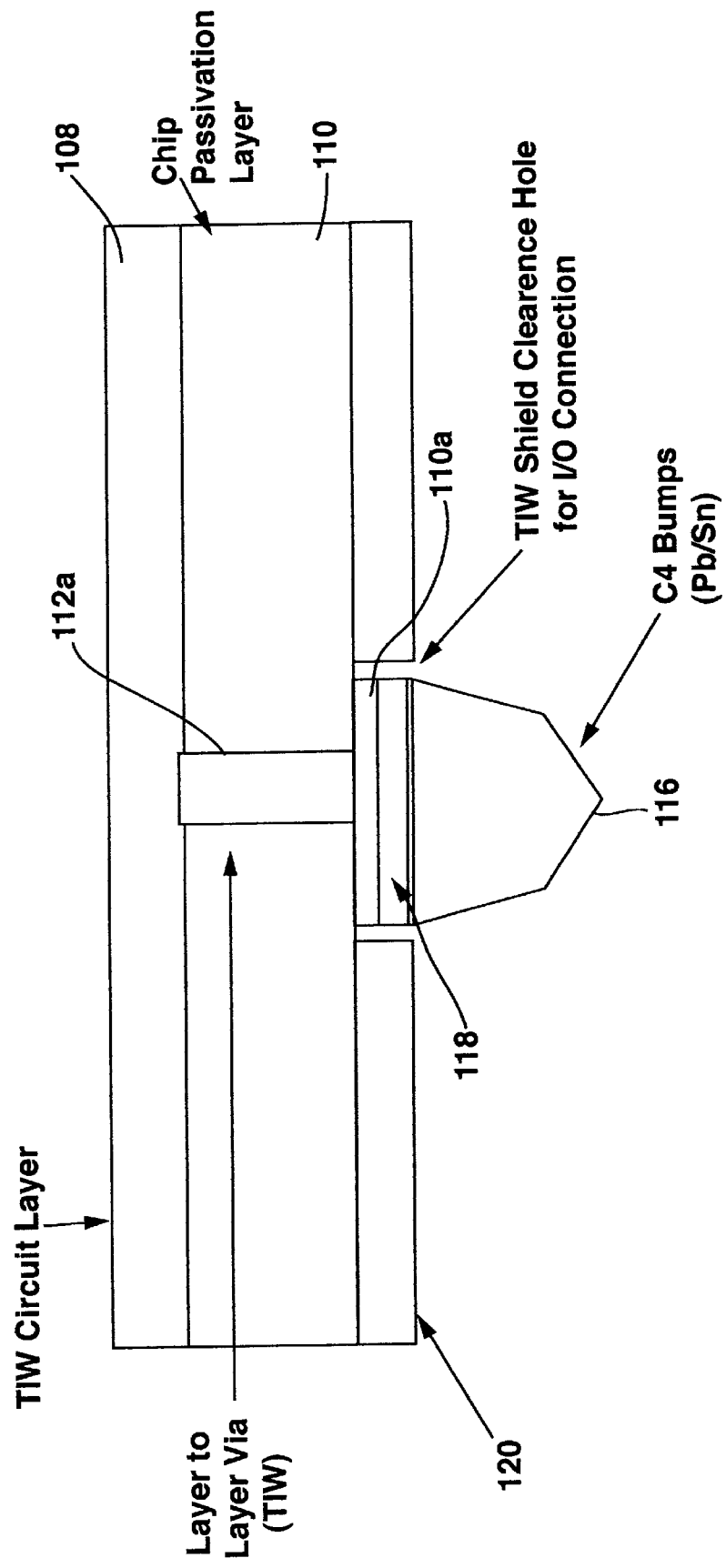
FIG. 2 is an enlarged view of the encircled region of FIG. 1.

FIG. 2 is an enlarged view of the encircled region 2 of FIG. 1. Layer 108 in FIG. 2 represents the terminal metallic wiring-layer of the metallic wiring layers represented by wiring layer 104 in FIG. 1.

Microchip 102 has passivation layer 110 disposed on wiring layer 108, as demonstrated in FIG. 2. Any material suitable for passivation layers may be used for passivation layer 110, such as polymide, SiO2, silicon nitride, or the like.

Microchip 102 has a multitude of vias for electrically interconnecting various metallic wiring-layers, as demonstrated by vias 112 and 112a in FIGS. 1 and 2, respectively. In one embodiment, vias 112 and 112a are formulations of high-Z materials, such as formulations of titanium and tungsten. However, vias 112 and 112a may be of any material suitable for vias.

Microchip 102 has a multitude of electrically conducting protuberances, as exemplified by protuberance 116 in FIGS. 1 and 2. In one embodiment, protuberance 116 is a solder bump of the type suitable for flip-chip joining methods, such as IBM's C4 (controlled collapse chip connection) chip-joining method. The electrically conducting protuberances form an array over the bottom of microchip 102.

FIG. 2 demonstrates that protuberance 116 is disposed on bonding pad 118. Bonding pad 118 may be of any material suitable for bonding pads, such as a formulation of chromium and copper. Bonding pad 118 is disposed on pad 110a, which is an extension of passivation layer 110, as demonstrated in FIG. 2. Protuberance 116 is electrically interconnected to wiring layer 108 by via 112a, shown to pass through passivation layer 110 in FIG. 2.

Microchip 102 has a shield, exemplified by shield 120 in FIGS. 1 and 2, disposed on passivation layer 110, for protecting against electromagnetic radiation. Shield 120 is electrically isolated from protuberance 116 and bonding pad 118, as shown in FIG. 2. Shield 120 is a formulation of high-Z materials, such as a formulation of titanium and tungsten.

Microchip 102 also has a shield, exemplified by shield 122 in FIG. 1, disposed opposite to shield 120, for protecting against electromagnetic radiation. Shield 122 is a formulation of high-Z materials, such as a formulation of titanium and tungsten.

Figure 3:
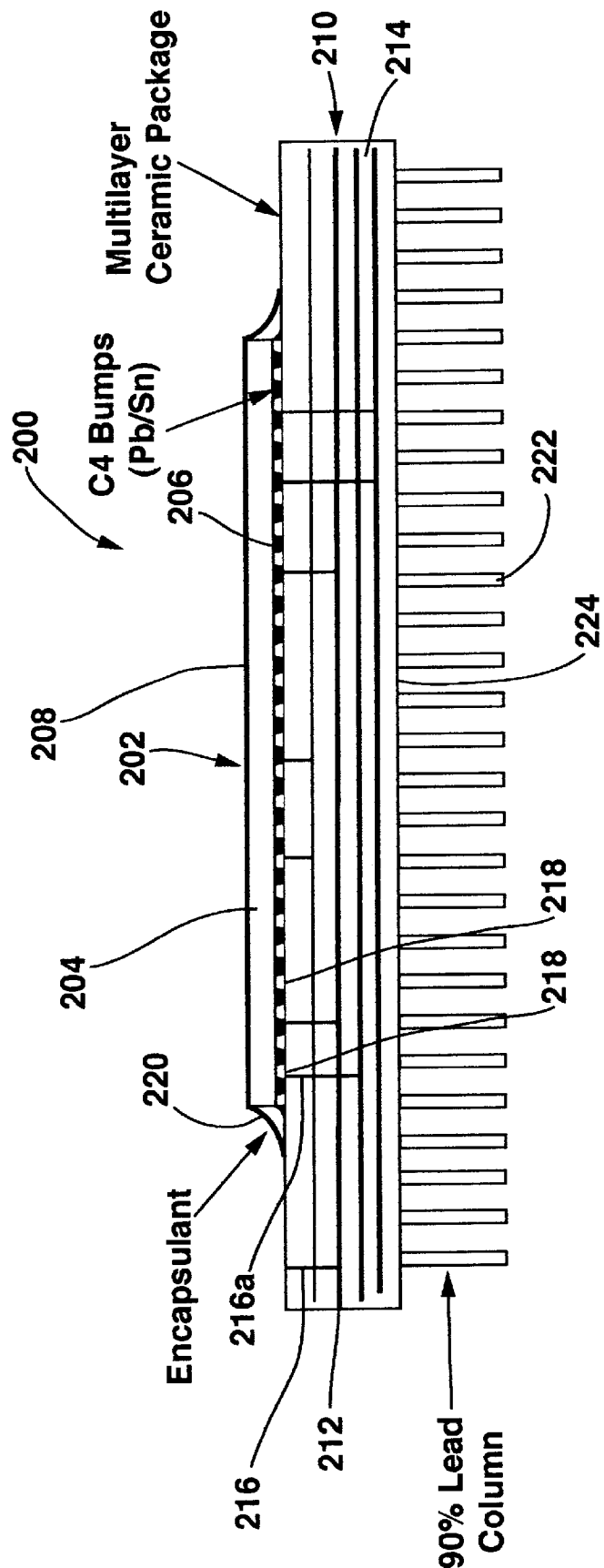
FIG. 3 is a cross-sectional view of the microchip package representing the second embodiment of the present invention.

The second embodiment of the present invention is demonstrated by microchip package 200 in FIG. 3. Package 200 includes microchip 202. Microchip 202 has a multitude of alternating metallic wiring layers and non-metallic layers. Various metallic wiring layers are interconnected by vias. Metallic wiring layers may be of any metal suitable for microchip wiring layers, e.g., formulations of low-Z materials, such as copper and aluminum, or formulations of high-Z materials, such as titanium and tungsten. Non-metallic wiring layers may be of any semi-conducting material suitable for microchip processing, such as Si, SiO$_2$, Ge, GaAs, GaAsP, or the like. The vias may be of any material suitable for vias, e.g., formulations of high-Z materials, such as formulations of titanium and tungsten.

The metallic and non-metallic layers are formed on wafer 204. Wafer 204 may be any material suitable for making microchips, such as Si, SiO$_2$, Ge, GaAs, GaAsP, or the like. Microchip 202 includes a multiplicity of electrically conducting protuberances, exemplified by protuberance 206. Electrically conducting protuberances 206 are connected to various wiring layers by vias. In one embodiment, protuberance 216 is a solder bump of the type suitable for flip-chip joining methods, such as IBM's C4 (controlled collapse chip connection) chip-joining method. Electrically conducting protuberances 206 form an array over the bottom of microchip 202.

Microchip 202 has a passivation layer disposed between a wiring layer adjacent the electrically conducting protuberances 206 and the electrically conducting protuberances 206. Any material suitable for passivation layers may be used for the passivation layer, such as polymide, SiO$_2$, silicon nitride, or the like. Microchip 202 has a shield disposed on the passivation layer that is adapted to protect against electromagnetic radiation. The shield is electrically isolated from the electrically conducting protuberances 206. The shield is a formulation of high-Z materials, such as a formulation of titanium and tungsten. Microchip 202 also has shield 208 disposed as shown in FIG. 3 that is adapted to protect against electromagnetic radiation. Shield 208 is a formulation of high-Z materials, such as a formulation of titanium and tungsten.

Microchip package 200 has a substrate, exemplified by substrate 210 in FIG. 3. Substrate 210 has a multiplicity of metallic wiring layers (demonstrated by wiring layer 212) interspersed among a multiplicity of non-metallic layers (demonstrated by layer 214). Wiring layers 212 are electrically interconnected using a multiplicity of vias, as demonstrated by vias 216 and 216a. Substrate 210 may be of any material suitable for substrates, such as ceramic. Wiring layers 212 may be of any metal suitable for wiring layers, e.g., formulations of low-Z materials, such as copper and aluminum, or formulations of high-Z materials, such as titanium and tungsten. Vias 216 and 216a may be of any material suitable for vias, e.g., formulations of high-Z materials, such as formulations of titanium and tungsten. In one embodiment, layers 214 are of the same material as substrate 210.

The vias exemplified by via 230a extend to surface 218 of substrate 210 and are attached to electrically conducting traces (not shown) on the top surface. The electrically conducting traces, constituting a wiring layer of the type of wiring layer 212. Microchip 202 is joined to substrate 210 by mating electrically conducting protuberances 206 on a one-to-one basis with the electrically conducting traces on surface 218. Encapsulant 220 is bonded to both microchip 202 and surface 218, as shown in FIG. 3, for lowering the stress on the attachment between electrically conducting protuberances 206 and the electrically conducting traces. Encapsulant 220 may be any material suitable for this type of encapsulation, including a liquid-plastic formulation.

Microchip package 200 has a multiplicity of columns, exemplified by column 222 in FIG. 3, adapted to protect against electromagnetic radiation that are suitably attached to surface 224 of substrate 210. Column 222 is preferably at least 90 percent lead. However, column 222 may be of any suitable material that provides equivalent radiation protection and that may be attached to surface 224.

To manufacture the first embodiment of the present invention, as exemplified by microchip 102 in FIG. 1, a multitude of alternating metallic layers, as exemplified by metallic layer 104, and non-metallic layers, as exemplified by nonmetallic layer 106, terminating with metallic wiring-layer 108, are formed on wafer 105. A multitude of vias, exemplified by vias 112 and 112a in FIGS. 1 and 2, respectively, is formed on wafer 105 to electrically interconnect the metallic wiring layers. Bonding pads, as exemplified by bonding pad 118 in FIG. 2, are formed on various vias, exemplified by via 112a.

Passivation layer 110 is formed on metallic wiring layer 108 and the bonding pads. The portion of passivation layer 110 that covers the bonding pads is removed to expose the bonding pads.

Shield 120 is formed on passivation layer 110 and the bonding pads for protecting against electromagnetic radiation. In one embodiment, shield 120 is formed from a formulation of titanium and tungsten that is deposited using chemical vapor deposition. The portion of shield 120 that covers the bonding pads is removed to expose the bonding pads, and the bonding pads are electrically isolated from shield 120.

A multitude of electrically conducting protuberances, as exemplified by electrically conducting protuberance 116 in FIGS. 1 and 2, is formed on the bonding pads. In one embodiment, electrically conducting protuberances 116 are solder balls of the type used in flip-chip joining techniques and are deposited on the bonding pads. Shield 122 is formed on wafer 105 opposite to shield 120, as shown in FIG. 1. In one embodiment, shield 122 is formed from a formulation of titanium and tungsten that is either deposited using chemical vapor deposition or electroplated.

To manufacture the second embodiment of the present invention, exemplified by microchip package 200 in FIG. 3, microchip 202 is formed. To form microchip 202, a multitude of alternating metallic wiring layers and non-metallic layers are formed on wafer 204. A terminal metallic wiring layer is formed. A multitude of vias is formed on wafer 204. The vias are used to electrically interconnect various metallic-wiring layers. The vias are used to electrically interconnect the terminal metallic wiring layer to various metallic-wiring layers. Bonding pads are formed on the vias used to electrically interconnect the terminal metallic wiring layer to various metallic-wiring layers. A passivation layer is formed on the terminal metallic wiring layer and the bonding pads. The portion of the passivation layer that covers the bonding pads is removed to expose the bonding pads. A shield is formed on the passivation layer and the bonding pads to protect against electromagnetic radiation. In one embodiment, the shield is formed from a formulation of titanium and tungsten that is deposited using chemical vapor deposition.

The portion of the shield that covers the bonding pads is removed to expose the bonding pads, and the bonding pads are electrically isolated from the shield. A multitude of electrically conducting protuberances, as exemplified by electrically conducting protuberance 206 in FIG. 3, are formed on the bonding pads. In one embodiment, electrically conducting protuberances 206 are solder balls of the type used in flip-chip joining techniques and are deposited on the bonding pads. Shield 208 is formed on wafer 204. In one embodiment, shield 208 is formed from a formulation of titanium and tungsten that is either deposited using chemical vapor deposition or electroplated.

Substrate 210 is formed. To form substrate 210, a multitude of alternating metallic layers, as exemplified by metallic layer 212, and non-metallic layers, as exemplified by non-metallic layer 214, are formed on substrate 210. A multitude of electrically conducting traces is formed on surface 218. A multitude of vias, exemplified by vias 216 in FIG. 3, is formed on substrate 210 to electrically interconnect various metallic-wiring layers. A multitude of vias, exemplified by vias 216a, is formed on substrate 210 to electrically interconnect the electrically conducting traces to various metallic-wiring layers.

A multitude of columns, exemplified by column 234 in FIG. 3, for protecting against electromagnetic radiation is attached to surface 224 of substrate 210. The multitude of electrically conducting protuberances, as exemplified by electrically conducting protuberance 206 in FIG. 3, are joined the electrically conducting traces (not shown) on surface 218 on a one-to-one basis. In one embodiment, the electrically conducting protuberances are solder bumps and are joined to the electrically conducting traces using standard flip-chip joining techniques. Encapsulant 232 is then bonded to microchip 202 and surface 218.

CONCLUSION

Embodiments of the present invention have been described. The embodiments provide a microchip having a passivation layer disposed on an electrically active surface; a multitude of electrically conducting protuberances for electrically coupling the electrically active surface to a substrate; a layer, disposed on the passivation layer, adapted to protect the microchip against electromagnetic radiation; and a layer for protecting the microchip against electromagnetic radiation disposed on an electrically inactive surface.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention.

What is claimed is:

1. A method for manufacturing a microchip, the method comprising:

forming a plurality of alternating metallic wiring-layers and non-metallic layers on a wafer, terminating with a metallic wiring-layer;

forming a plurality of vias for electrically interconnecting various metallic wiring-layers;

forming a plurality of electrically conducting pads adjacent various vias;

forming a passivation layer adjacent the terminal metallic wiring-layer and the plurality of conducting pads;

removing a portion of the passivation layer to expose the plurality of conducting pads;

forming a layer adjacent the passivation layer and the plurality of exposed conducting pads for protecting the microchip against electromagnetic radiation;

removing a portion of the protective layer to expose the plurality of conducting pads;

isolating each conducting pad, electrically, from the protective layer; and forming an electrically conducting bump on each conducting pad.

2. The method of claim 1, wherein forming the protective layer includes using a formulation of high-Z materials for the protective layer.

3. The method of claim 1, wherein forming the protective layer includes depositing the protective layer using chemical vapor deposition.

4. The method of claim 1 further comprising forming a backside layer on a side of the microchip opposite the protective layer formed on the passivation layer for protecting against electromagnetic radiation.

5. The method of claim 4, wherein forming the backside layer includes using a formulation of high-Z materials for the backside layer.

6. A method for manufacturing a microchip, the method comprising:

forming a plurality of alternating metallic wiring-layers and non-metallic layers on a wafer, terminating with a metallic wiring-layer;

forming a plurality of vias for electrically interconnecting various metallic wiring-layers;

forming a plurality of electrically conducting pads adjacent various vias;

forming a passivation layer adjacent the terminal metallic wiring-layer and the plurality of conducting pads;

removing a portion of the passivation layer to expose the plurality of conducting pads;

forming a layer adjacent the passivation layer and the plurality of exposed conducting pads for protecting the microchip from electromagnetic radiation;

removing a portion of the protective layer to expose the plurality of conducting pads;

isolating each conducting pad, electrically, from the protective layer;

depositing an electrically conducting bump on each conducting pad; and forming a backside layer on a side of the microchip opposite the protective layer formed on the passivation layer for protecting against electromagnetic radiation.

7. The method of claim 6, wherein forming the backside layer includes using a formulation of high-Z materials for the backside layer.

8. The method of claim 6, wherein forming the backside layer includes depositing the protective layer using chemical vapor deposition.

9. The method of claim 6, wherein forming the backside layer includes electroplating.

10. A method for manufacturing a microchip package, the method comprising:

forming a substrate having opposing first and second surfaces, the first surface having a plurality of electrically conducting traces thereon;

forming a microchip having opposing electrically active and inactive surfaces, the electrically active surface having a passivation layer thereon and a plurality of electrically conducting protuberances electrically coupled thereto;

forming a first layer for protecting the microchip against electromagnetic radiation on the passivation layer so that the first protective layer is electrically isolated from the electrically conducting protuberances;

forming a second layer for protecting the microchip against electromagnetic radiation on the electrically inactive surface of the microchip;

forming a plurality of columns for protecting the microchip from electromagnetic radiation on the second surface of the substrate and;

attaching the electrically conducting protuberances to the electrically conducting traces on a one-to-one basis.

11. The method of claim 10, wherein forming the plurality of columns includes using at least 90% lead for each of the columns.

12. The method of claim 10, further comprising bonding an encapsulant to both the microchip and the substrate.

* * * * *

UNITED STATES PATENT AND TRADEMARK OFFICE
CERTIFICATE OF CORRECTION

PATENT NO.    : 6,544,879 B2
DATED         : April 8, 2003
INVENTOR(S)   : Shah et al.

It is certified that error appears in the above-identified patent and that said Letters Patent is hereby corrected as shown below:

<u>Title page,</u>
Item [75], Inventor, please correct "Tushar T. Shah" to -- Tushar K. Shah --.

Signed and Sealed this

Thirteenth Day of July, 2004

JON W. DUDAS
*Acting Director of the United States Patent and Trademark Office*